United States Patent [19]
Anthony et al.

[11] 4,021,269
[45] May 3, 1977

[54] POST DIFFUSION AFTER TEMPERATURE GRADIENT ZONE MELTING

[75] Inventors: Thomas R. Anthony, Schenectady; Mike F. Chang, Liverpool; Harvey E. Cline, Schenectady, all of N.Y.

[73] Assignee: General Electric Company, Syracuse, N.Y.

[22] Filed: Nov. 26, 1975

[21] Appl. No.: 635,368

[52] U.S. Cl. ................ 148/1.5; 148/171; 148/172; 148/186; 148/187; 148/188; 148/177; 148/179; 252/62.3 GA; 252/62.3 E
[51] Int. Cl.² ........................ H01L 21/228
[58] Field of Search .......... 148/1.5, 171, 172, 187, 148/186, 188, 177, 179; 252/62.3 GA, 62.3 E

[56] References Cited
UNITED STATES PATENTS

| 2,813,048 | 11/1957 | Pfann | 148/1 |
| 3,936,319 | 2/1976 | Anthony et al. | 136/89 |
| 3,972,741 | 8/1976 | Anthony et al. | 148/1.5 |

*Primary Examiner*—G. Ozaki
*Attorney, Agent, or Firm*—R. J. Mooney; D. E. Stoner

[57] ABSTRACT

Disclosed is a technique useful in the manufacture of semiconductor devices. When a semiconductor device is manufactured by the temperature gradient zone melting process, it is subjected to a short diffusion cycle following thermomigration. The cycle smooths out discontinuities caused by breaks in wire migration and effectively seals and isolates occluded particles of the impurity remaining in the semiconductor body. The cycle is also useful for providing large area doped regions that cannot be formed by wire migration due to constraints on wire direction.

12 Claims, 17 Drawing Figures

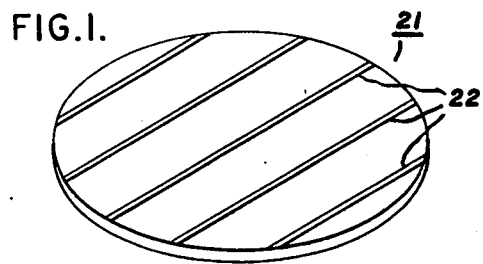
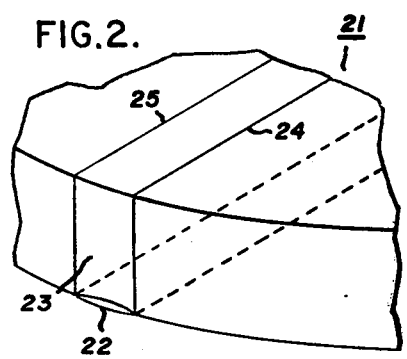
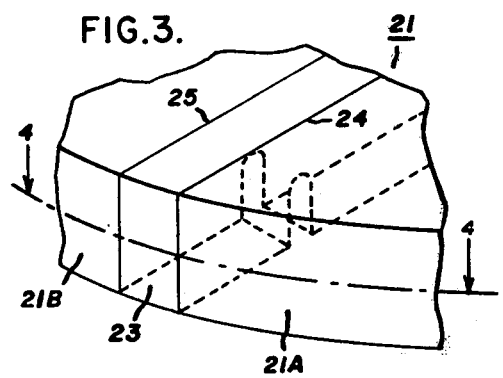
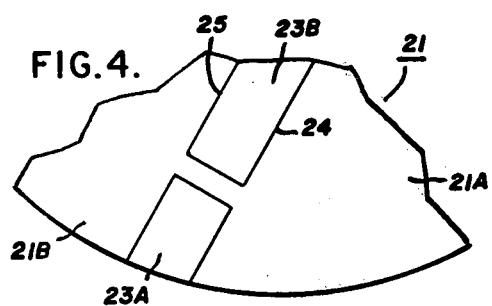
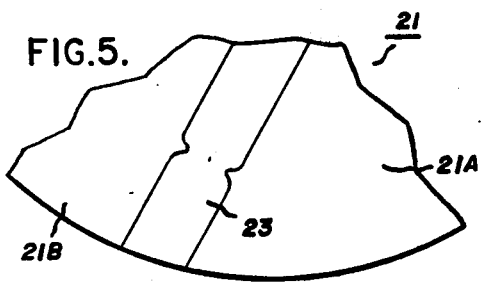
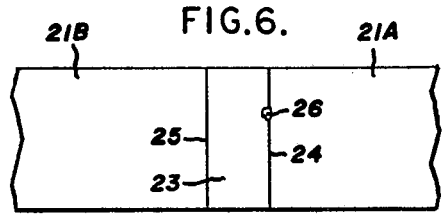
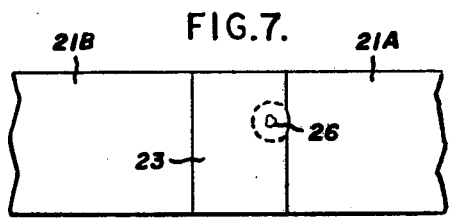
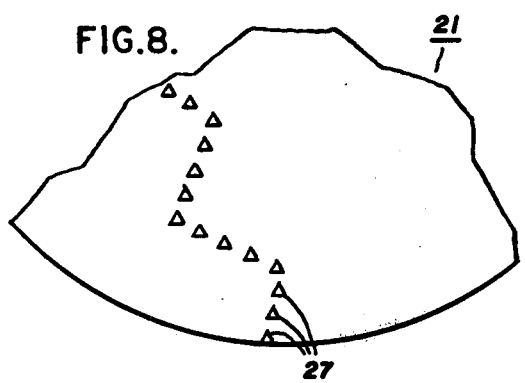
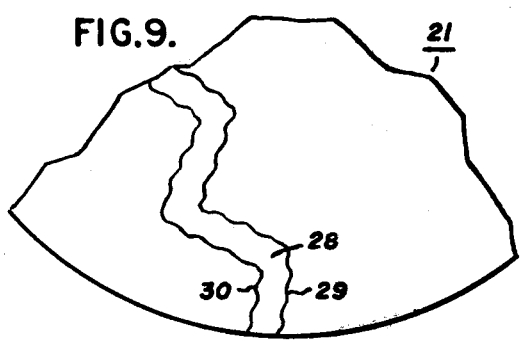
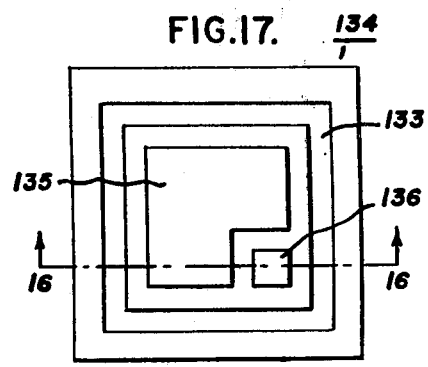

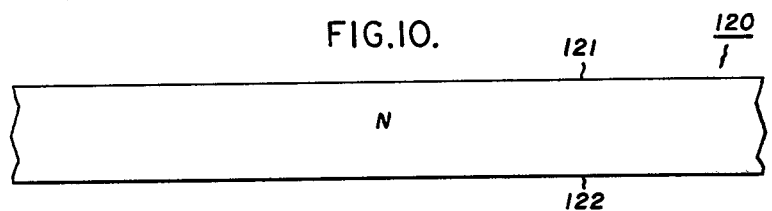
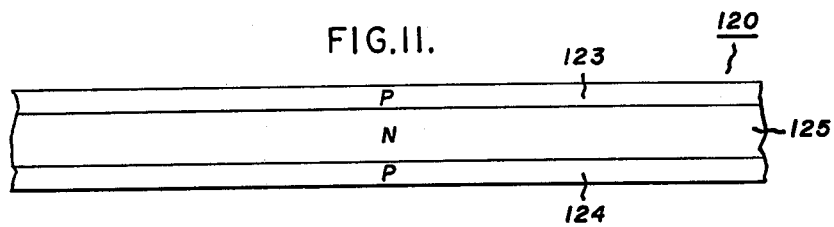
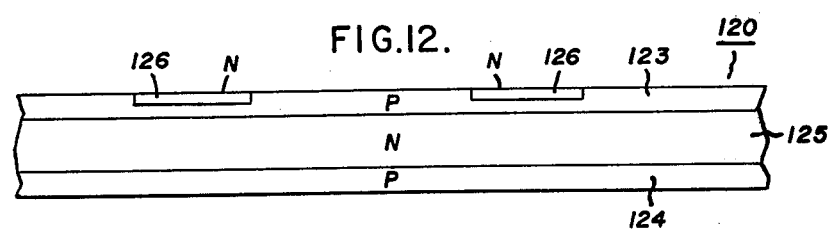
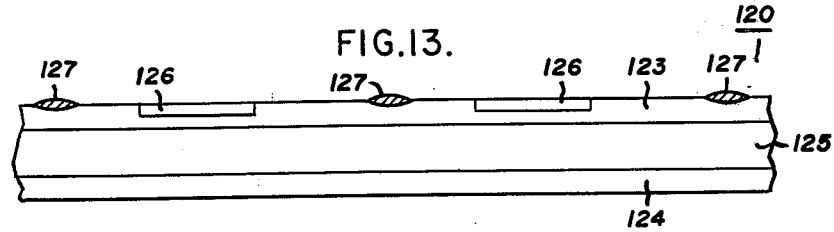
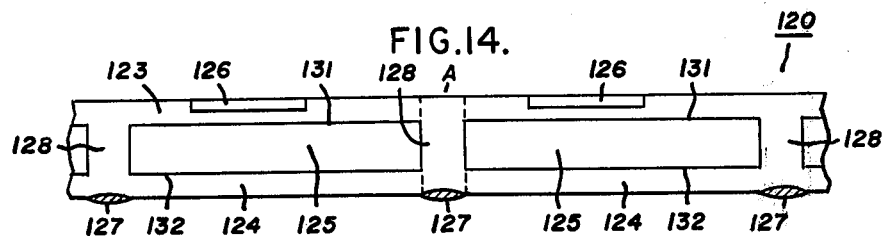
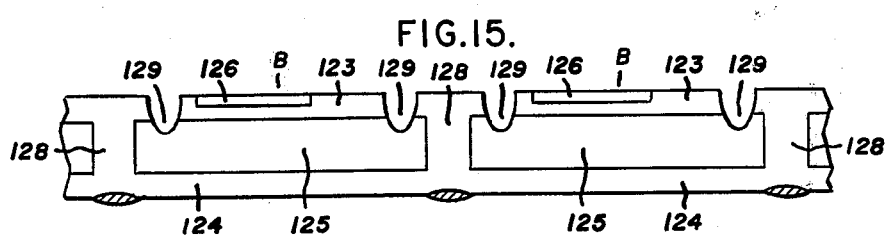
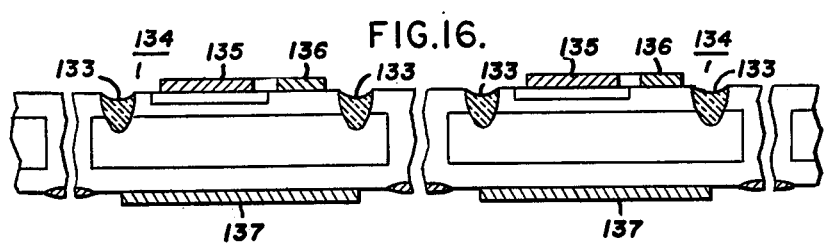

POST DIFFUSION AFTER TEMPERATURE GRADIENT ZONE MELTING

BACKGROUND OF THE INVENTION

This invention relates to semiconductor devices and, more particularly, to steps useful in the manufacture of semiconductor devices by temperature gradient zone melting.

The temperature gradient zone melting process is carried out be selectively depositing an impurity on a body of semiconductor material and exposing the body to a temperature gradient while the entire body is maintained at a preselected elevated temperature. Typically, if the temperature of the body is in excess of about 800° or 900° C, a temperature gradient of a few degrees to a few hundred degrees will cause the impurity to migrate through the body, from cold to hot, leaving in its path a recrystallized region doped to the solid solubility limit of the impurity in the semiconductor wafer at the migration temperature. As a specific example, migration of aluminum through a semiconductor wafer approximately 16 mils thick at 1200° C with a gradient of about 5° across the wafer will take place in 5 to 10 minutes.

For further background information relating to temperature gradient zone melting, reference is made to U.S. Pat. No. 3,899,362 issued to H. E. Cline et al and U.S. patent application Ser. No. 578,807 filed May 19, 1975, in the name of John K. Boah and entitled, "Temperature Gradient Zone Melting Utilizing Infrared Radiation," both assigned to the present assignee.

A problem occasionally encountered during the manufacture of semiconductor devices by temperature gradient zone melting is that the body of impurity material sometimes breaks up during migration. This gives rise to two distinct effects. The first effect can occur when forming large area regions by migrating a wire through a semiconductor wafer. If the wire breaks into two shorter sections, a nondoped region will be formed and the desired large planar region will actually be two smaller continuous planar regions.

The second effect occurs when small particles of the impurity material become separated from the main body thereof during migration. Smaller bodies of material migrate more slowly and thus may still be disposed inside the semiconductor wafer at the termination of migration. If a particle of the metallic impurity remains at or near a P/N junction, it can short the junction or substantially increase the junction leakage current.

These problems do not generally occur, but when they do, device yield suffers. Semiconductor manufacturing is an extremely competitive, cost-conscious industry, and thus, higher yields are constantly being sought.

It is an object of this invention, therefore, to provide a process that is compatible with temperature gradient zone melting procedures and alleviates the aforementioned problems.

SUMMARY OF THE INVENTION

This invention is characterized by a technique useful in the manufacture of semiconductor devices when temperature gradient zone melting is employed. First, a body of semiconductor material is supplied. The body, commonly a wafer, has distributed therethrough an impurity which imparts one conductivity type. At least one region of the opposite conductivity type is formed in the wafer by migrating a quantity of a second dopant material therethrough by temperature gradient zone melting. Consequently, a P/N junction is defined between the region of the opposite conductivity type and the surrounding semiconductor material. Next, the wafer is subjected to a diffusion cycle which improves the properties of the P/N junction and makes it more uniform.

As stated above, small particles of the second impurity will occasionally become separated from the mass thereof, and, due to the slower migration rates of smaller bodies, they may become occluded in the semiconductor wafer. The present invention alleviates resulting problems because the diffusion cycle forms a region of the second conductivity type completely surrounding the particle of impurity. Thus, the occluded impurity is electrically separated from all P/N junctions.

When two contiguous planar regions of the second conductivity type are formed due to a discontinuity in a migrating wire as described above, the subject invention is also effective. The diffusion cycle of the subject invention causes outdiffusion in all directions from the planar regions, and thus, the small separation between the two contiguous regions is soon eliminated. It has been found that a diffusion cycle in the range of 4 to 16 hours at about 1200° C is adequate to achieve the aforementioned objectives.

The subject diffusion cycle is also found useful for forming large area regions that otherwise would be more difficult to form. In certain crystallographic planes given wire directions are leas satisfactory for thermomigration. However, if the desired region apparently requires migration in one of these directions, a series of small area dots can be deposited on the wafer surface rather than a single wire. The plurality of dots can be migrated through forming a plurality of closed spaced, substantially parallel linear regions, each surrounded by a P/N junction. Subsequent diffusion causes a merger of the several regions into a single uniform region.

DESCRIPTION OF THE DRAWINGS

These and other features and objects of the present invention will become more apparent upon a perusal of the following description taken in conjunction with the accompanying drawings in which:

FIG. 1 is an isometric view of a semiconductor wafer prepared for thermomigration;

FIG. 2 is a detail view of a portion of the wafer in FIG. 1 following the migration step;

FIG. 3 is a view similar to FIG. 2 showing a possible defect that may occur during migration;

FIG. 4 is a plan sectional view showing the defect of FIG. 3 in more detail;

FIG. 5 is a plan sectional view similar to FIG. 4 illustrating the elimination of the defect following the subject diffusion cycle;

FIG. 6 is a sectional elevation view of a semiconductor wafer following thermomigration with a small particle of impurity occluded therein;

FIG. 7 illustrates the enclosure of the particle of impurity following the subject diffusion cycle;

FIG. 8 is a plan view of a portion of a semiconductor wafer with a plurality of dots deposited thereon to form a plurality of parallel linear regions;

FIG. 9 illustrates the portion of wafer shown in FIG. 8 following migration and the subject diffusion cycle;

FIG. 10 is a sectional elevation view of a semiconductor wafer prepared for processing in a manner which will illustrate the use of the subject invention;

FIG. 11 is a sectional elevation view of the wafer of FIG. 10 following initial diffusion in accordance with the subject invention;

FIG. 12 is an elevation view of the wafer of FIGS. 10 and 11 following yet another diffusion step;

FIG. 13 is an elevation view of the wafer of FIG. 12 as it is prepared for the thermomigration step;

FIG. 14 is an elevation view of the wafer of FIG. 13 following thermomigration;

FIG. 15 is an elevation view of the wafer following the formation of peripheral grooves;

FIG. 16 illustrates finished semiconductor controlled rectifier (SCR) device pellets fabricated in accordance with the teachings herein; and FIG. 17 is a plan view of an SCR pellet.

DESCRIPTION OF THE PREFERRED METHOD

Referring first to FIG. 1, there is shown a body of semiconductor material in the form of a semiconductor wafer 21. An impurity which induces a given conductivity type is distributed throughout the wafer 21. For example, the wafer can be n-type silicon. However, it should be realized other semiconductor materials, such as germanium and Group III–V and II–VI compounds could be used. The wafer 21 is shown prepared for thermomigration of several bodies 22 of a second impurity therethrough. Preferably, the wafer surfaces are in a crystallographic plane selected from the Group consisting of (100), (110) and (111). If the wafer 21 is n-type silicon, the second type of impurity can advantageously be, for example, aluminum.

The aluminum, or other second impurity, is shown as a plurality of parallel wires 22 for simplicity. If wires are used, they will frequently be deposited in a plurality of intersecting sets of substantially parallel wires such that the wafer will be divided into several areas. That is, of course, well known in the prior art. Alternately, the impurity 22 can be deposited in the form of circles, dots, or the like.

Prior to temperature gradient zone melting, the impurity 22 must be in intimate contact with the wafer 21 and preferably restrained in a selected area. Thus it is helpful to slightly groove the surface of the wafer where the impurity is to be placed. Alternatively, the aluminum can be alloyed or thermocompression bonded in place. Such methods of intimately associating the impurity and the wafer are known in the prior art. See, for example, U.S. Pat. Nos. 3,895,967 issued to T. R. Anthony, et al; 3,901,736 issued to T. R. Anthony, et al; and 3,897,227 issued to S. M. Blumenfeld; all assigned to the present assignee. Or, the impurity can be restrained by an opening in an oxide mask. See the U.S. Pat. Application entitled, "Method For The Thermomigration of Selected Metals Through Bodies of Semiconductor Material" filed Nov. 21, 1975 by Chang, et al. and assigned Ser. No. 634,247.

Referring now to FIG. 2, there is shown a portion of the wafer 21 following the thermomigration step. The impurity 22 is on the lower surface of the wafer and in its path is a region 23 of the opposite, P, conductivity type which contains the impurity in a uniform distribution in an amount equal to the solid solubility limit of the impurity in the wafer 21 at the elevated temperature of migration. The region 23 in conjunction with the surrounding portions of the wafer 21 defines two P/N junctions 24 and 25. The subject invention contemplates a diffusion cycle following the thermomigration to make more uniform and improve the properties of the junctions 24 and 25.

Considering the large area planar* region 23 formed by the migration of a wire, a difficulty that can arise therewith is depicted in FIG. 3. If, during migration, the wire 22 (omitted in FIG. 3 and subsequent Figures to preserve clarity) breaks, the region 23 will become two contiguous large area regions separated by a discontinuity as depicted by the broken line of FIG. 2. This is clearly shown in the sectional FIG. 4 where the region 23 is divided into the regions 23A and 23B. Sometimes the wire will break at the inception of migration and the discontinuity will extend from one surface of the wafer to the other.

*planar, as used herein, is not to be limited in its meaning to flat. It is used to indicate large area junctions as opposed to linear junctions which are obtained by thermomigrating dots of dopant.

Often, back-to-back P/N junctions 24 and 25 of the nature illustrated are expected to electrically isolate the regions of the wafer 21A and 21B. It is evident from FIGS. 3 and 4 that such isolation is not achieved if the wire breaks. This effect does not usually occur in temperature gradient zone migration, but when it does occur, it reduces device yields.

Referring now to FIG. 5, there is shown the wafer of FIG. 4 following the short diffusion cycle contemplated by the subject invention. It is clear that the regions 23A and 23B have each outdiffused in all directions and that they have thus eliminated the discontinuity and formed a single region 23. Thus, the regions 21A and 21B of the wafer are electrically isolated as desired.

A short diffusion cycle of about 4 hours at 1200° C is advantageous following wire migration in order to eliminate most small discontinuities. However, if, under microscopic examination, breaks such as depicted in FIGS. 3 and 4 are evident on the surface of the wafer, the diffusion cycle can be lengthened as needed. For example, a diffusion cycle of approximately 16 hours will close a discontinuity in excess of 2.5 mils when aluminum has been migrated through silicon. Diffusion constants for other semiconductor materials and other dopants vary. However, choosing a proper diffusion cycle is well within the ability of those skilled in the art.

Referring now to FIG. 6, there is shown a sectional elevation view of a portion of the wafer 21 showing the two regions 21A and 21B and the region of opposite conductivity type 23. As described above, occasionally a small particle 26 of the impurity will become occluded near a P/N junction 24 or 25. As shown, the particle 26 is shorting the junction 24 and will cause it to pass an excessively high leakage current.

During the above described diffusion cycle, the region 23 becomes wider due to diffusion, and the particle 26 itself acts as a dopant source and grows a region of the opposite conductivity type around it. The total effect is shown in FIG. 7.

The individual region of opposite conductivity type around the particle 26 is not visible in FIG. 7 inasmuch as it is merged with the outdiffusion of the region 23. The region formed by the particle 26 is shown in broken lines. Thus, it will be appreciated that independently of the region 23, the particle will be surrounded by a region of opposite conductivity type and therefore be electrically isolated.

It will be appreciated from an observation of FIG. 7 that a diffusion cycle as described above effectively isolates the small occluded metal particles. It should, of course, be realized that if the occluded particle 26 is in the region 23, separated from the P/N junctions, it is less significant electrically, but the subject diffusion cycle provides added assurance that it will be isolated. No occluded metal particles appear outside the region 23 inasmuch as no impurity migrates therethrough.

Referring now to FIG. 8, there is shown a plan view of the upper surface of the wafer 21. The surface is preferably in one of the preferred crystallographic planes in accordance with the following table:

Table

| Wafer Plane | Migration Direction | | Stable Wire Directions | Stable Wire Sizes |
|---|---|---|---|---|
| (100) | <100> | | <011>* | <100 microns |
| | | | <011>* | <100 microns |
| (110) | <110> | | <110>* | <150 microns |
| (111) | <111> | +(a) | <011> | |
| | | | <101> | <500 microns |
| | | | <110> | |
| | | +(b) | <112>* | |
| | | | <211>* | <500 microns |
| | | | <121>* | |
| | | +(c) | Any other * Direction in (111) plane* | <500 microns |

*The stability of the migrating wire is sensitive to the alignment of the thermal gradient with the <100>, <110> and <111> axis, respectively.
+Group a is more stable than group b which is more stable than group c.

If it is desired to form a region requiring the migration of an irregularly shaped wire or a wire oriented in a direction that is unstable (as indicated by the above table), the following method can be used: The area where the region is to be formed is covered with a plurality of closely spaced dots of the second dopant material. When these dots are migrated through the wafer, they will form a plurality of closely spaced linear, substantially parallel regions 27 of the second conductivity type, each defining a P/N junction with the surrounding semiconductor material. The regions are perpendicular to the paper in FIG. 8. The regions 27 are depicted in FIG. 8 as being triangular. It should be realized that the shape of the regions depends only on which of the preferred planes is defined by the surface of the wafer. The precise shape of the regions, circular, triangular, rectangular, etc., is unimportant for the purposes of this invention. For further information regarding the shape of the regions that will be formed, attention is directed to the co-pending patent application entitled, "Multiple P/N Junction Formation With An Alloyed Droplet," assigned Ser. No. 464,801 filed Apr. 29, 1974, by Anthony, et al.

When the wafer as depicted in FIG. 8 is exposed to the aforementioned diffusion cycle, the separate regions 27 merge to form a single region 28 defining but two essentially uniform, continuous P/N junctions 29 and 30. Thus, it will be appreciated that the subject diffusion cycle can merge a plurality of P/N junctions into a single uniform junction.

The dots that are migrated to form the embodiment depicted in FIG. 9 are, in the case of aluminum and silicon, stable if they are between 0.175 and 1.0 millimeters across. Preferably, the dots are separated from edge to edge by no more than about 2.5 mils. The invention is operable if the dots are further separated. However, the diffusion cycle must then be made longer, and practical considerations suggest that it should be kept as short as possible. A diffusion cycle of 16 hours at 1200° C is sufficient if aluminum dots are separated from edge to edge by no more than 2.5 mils.

The following is an example of a semiconductor device fabrication method in which the subject diffusion cycle is useful.

Referring first to FIG. 10, there is shown a wafer 120 of semiconductor material which defines two major surfaces 121 and 122. The wafer may be any convenient size such as normally used in the semiconductor processing art. For example, it may be approximately 16 mils in thickness and 2 inches in diameter. Only a portion of the wafer 120 is shown in order to preserve clarity in the Figures.

The wafer 120 contains a first type of impurity that imparts to the wafer one conductivity type. For purposes of illustration, it will subsequently be assumed that the wafer 120 consists of silicon and that the one conductivity type is N-type. Thus, the first type of impurity is an impurity that imparts N-type conductivity, such as arsenic or phosphorus.

Referring now to FIG. 11, there is shown an elevation view of the wafer 120 following a subsequent processing step. A second type of impurity which imparts to the wafer the opposite, or P, conductivity type is diffused in from each major surface. The second type of impurity can be, for example, gallium or boron. Thus, the wafer 120 has three stacked layers or regions, two outer P-type regions 123 and 124, and an interior N-type region 125. In the example being pursued, that is utilizing a 16 mil thick wafer the regions 123 and 124 are each preferably about three mils in thickness. A 3-mil depth will be reached following a diffusion time of about 45 hours at 1250° C. Such diffusion cycles are well known in the prior art.

Referring now to FIG. 12, there is shown the wafer of FIG. 11 with spaced cathode emitter regions 126 diffused part way through the region 123. The cathode emitter regions are N-type and can be formed by the diffusion of a first type of impurity at 1250° C for approximately 10 to 15 hours. Again, such diffusion cycles are well known in the prior art as are the preceding photoresist masking steps. The cathode emitter regions could also be formed by other conventional techniques, such as alloying.

Referring now to FIG. 13, there is shown the wafer 120 of FIG. 12 prepared for the temperature gradient zone melting, or thermomigration, step. Elongated bodies 127 of a second type of impurity, such as aluminum, are disposed on the major surface 121. The elongated bodies run perpendicularly to the paper and thus their size is not fully appreciated solely from FIG. 13.

Referring now to FIG. 14, there is shown the wafer 120 of FIG. 13 following the thermomigration step. The elongated bodies of material 127 have migrated through the wafer from the major surface 121 to the major surface 122 leaving in their path isolation regions 128 of the opposite, P, conductivity type. The isolation regions are regions of silicon uniformly doped to the solid solubility limit of aluminum in silicon at the temperature of migration. The heavily doped isolation regions really extend completely from one major surface to the other as shown by the combination of solid and broken lines at A for the center region. However, the boundary of the isolation region indicated by the broken line has been omitted from the other regions in FIG. 14 and from subsequent Figures inasmuch as the regions 123 and 124 are P-type regions and thus no P/N junction exists between them and the regions 128.

FIG. 14 shows two device regions separated by the central isolation region 128 at A. Each device region consists of an interior region 125 of N-type conductivity completely surrounded by semiconductor material of P-type conductivity. It will be appreciated by those skilled in the art that the entire wafer 120 will usually contain many separate device regions. Furthermore, it will be appreciated by those skilled in the semiconductor art that the isolation regions 128 are formed in a grid pattern and really extend around the entire periphery of the device region. This is shown clearly in the subsequent plan views.

Referring now to FIG. 15, there is shown an elevation view of the wafer 120 with peripheral grooves 129 formed in the outer region 123 and extending into the interior region 125. The grooves 129 are formed by conventional photolithographic masking and etching techniques and extend along each of the isolation regions as illustrated in FIG. 17. In addition to the conventional masking and etching processes, it may be helpful to lightly etch the surface 121 near the isolation regions 128 following migration to smooth the surface. This process is fully described in a co-pending patent application filed concurrently herewith by M. F. Chang and entitled, "Post Temperature Gradient Zone Melting Surface Etch and assigned Ser. No. 635,327."

An examination of FIG. 15 reveals that the portions B of the region 123 within the peripheral groove 129 are electrically isolated from the region 124 due to the back-to-back P/N junctions 131 and 132. Thus, when the grooves are filled with a passivating material 133 as shown best in FIG. 16, the two semiconductor junctions 131 and 132 are completely passivated with a single groove and application of passivant material 133. The passivant material 133 can be glass applied in a known manner. However, it should be appreciated that other passivating material can be used. For example, oxide or one of the new organic passivant materials can be advantageously employed.

When wafer 120 is subdivided through the isolation regions 128 as shown in FIG. 16, individual semiconductor device pellets 134 are formed. Those skilled in the art will recognize the pellets 134 as SCR pellets. Finally, metal contacts 135, 136, and 137 are added in a conventional manner. A plan view of a pellet 134 is shown in FIG. 17.

However, it will also be apparent that if a defect of the nature illustrated in FIGS. 3 and 4 occurs during migration, part of the isolating P/N junction will be exposed at the pellet periphery following subdivision. However, it will not be passivated. A short diffusion cycle as described above will correct the defect as illustrated in FIG. 5, thus improving manufacturing yield. It is recommended that following migration the wafer be examined under a microscope. If no breaks in the wires 27 are seen, the wafer should be diffused for about 4 hours at 1200° C to close any small gaps that may be there and to enclose occlusions. If breaks are observed, the diffusion cycle should be lengthened to about 16 hours.

In light of the above teachings, many modifications and variations of the present invention will be obvious to those skilled in the art. The invention is, therefore, limited only by the following claims.

What is claimed is:

1. In the process of manufacturing a semiconductor device, the steps of:
   supplying a body of semiconductor material containing an impurity which imparts one conductivity type;
   forming a region of the opposite conductivity type in said body by migrating a second impurity therethrough by the temperature gradient zone melting process so as to define a P/N junction between said region and the surrounding portions of said body; and
   subjecting said body to a diffusion cycle to make said P/N junction more uniform and improve the properties thereof.

2. The steps of claim 1 wherein small particles of said second impurity become occluded in said body during migration and the diffusion cycle causes the formation of zones of said opposite conductivity type around said particles.

3. The steps of claim 2 wherein said body is silicon, said one conductivity type is N-type, and said impurity is aluminum.

4. The steps of claim 3 wherein said diffusion cycle is carried out at about 1200° C for about 4 to 16 hours.

5. The steps of claim 1 wherein said impurity is an elongated body and said region is planar, and breaks form in said elongated body during migration causing discontinuities in said region, and said diffusion cycle eliminates said discontinuities.

6. The steps of claim 5 wherein said body is silicon, said one conductivity type is N-type, and said impurity is aluminum.

7. The steps of claim 6 wherein said diffusion cycle is carried out at about 1200° C for about 4 to 16 hours.

8. The steps of claim 5 wherein the surface of said body through which said impurity enters is selected from the group of crystallographic planes consisting of (100), (110), and (111).

9. The steps of claim 1 wherein the surface of said body through which said impurity enters is selected from the group of crystallographic planes consisting of (100), (110), and (111), wherein said second impurity is initially deposited on said surface in the form of a plurality of closely spaced dots so that a plurality of substantially parallel linear regions of the opposite conductivity type are formed and said diffusion cycle causes said linear regions to merge with adjacent linear regions and form a continuous region.

10. The steps of claim 9 wherein said dots are separated by less than about 2.5 mils.

11. The steps of claim 10 wherein said body is silicon, said one conductivity type is N-type, and said impurity is aluminum.

12. The steps of claim 11 wherein said diffusion cycle is carried out at about 1200° C for about 4 to 16 hours.

* * * * *